United States Patent
Tsuda et al.

(10) Patent No.: US 7,486,160 B2
(45) Date of Patent: Feb. 3, 2009

(54) ELECTRONIC COMPONENT AND MANUFACTURING METHOD THEREOF

(75) Inventors: Toshimasa Tsuda, Sayama (JP); Seiji Abe, Sayama (JP); Minoru Sakai, Sayama (JP); Natsuhiko Sakairi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 209 days.

(21) Appl. No.: 11/484,270

(22) Filed: Jul. 10, 2006

(65) Prior Publication Data

US 2007/0008051 A1   Jan. 11, 2007

(30) Foreign Application Priority Data

Jul. 11, 2005   (JP) ............................. 2005-201697

(51) Int. Cl.
*H03H 9/00* (2006.01)
(52) U.S. Cl. .................. 333/193; 333/186; 333/187
(58) Field of Classification Search .................. None
See application file for complete search history.

(56) References Cited

U.S. PATENT DOCUMENTS

| 7,034,434 | B2 |  | 4/2006 | Yamamoto et al. |  |
| 7,154,206 | B2 | * | 12/2006 | Shimada et al. | 310/313 R |
| 2003/0000067 | A1 | * | 1/2003 | Hori | 29/592.1 |
| 2004/0159960 | A1 |  | 8/2004 | Fujiwara et al. |  |

FOREIGN PATENT DOCUMENTS

| JP | 8-316778 | 11/1996 |
| JP | 9-289429 | 11/1997 |
| JP | 2004-064732 | 2/2004 |
| JP | 2004-153579 | 5/2004 |
| JP | 2004-214469 | 7/2004 |

* cited by examiner

*Primary Examiner*—Anh Q Tran
(74) *Attorney, Agent, or Firm*—Jordan and Hamburg LLP (57) ABSTRACT

There is provided an electronic component excellent in moisture resistance capable of ensuring electrical connection between electrodes and hermeticity of a sealed region including a vibrating part and suppressing an increase in size. An electronic component including a piezoelectric element provided with a vibrating part and a first electrode on one face of a piezoelectric substrate and a printed circuit substrate having a second electrode is constituted by including: a bump provided in advance on one of the first electrode and the second electrode and connected to the other of the first electrode and the second electrode; an annular first metal layer surrounding the vibrating part; and a solder material with a solidus temperature lower than the bump, sealing a space between the first metal layer and the printed circuit substrate to make a placement region of the vibrating part a hermetic space, whereby moisture permeation into the hermetic space and the outward spread of the solder material can be suppressed, and a space for the bump to spread by being melted can be omitted. Moreover, the electrical connection between the electrodes and the sealing of the placement region can be performed in separate processes, so that high hermeticity can be obtained.

11 Claims, 8 Drawing Sheets

ELECTRONIC COMPONENT AND MANUFACTURING METHOD THEREOF

BACKGROUND OF THE INVENTION

1. Field of the Invention

The present invention relates to an electronic component including a piezoelectric element provided with vibrating part which generates a vibrational wave on a substrate and a manufacturing method thereof.

2. Description of the Related Art

As an example of a piezoelectric element, there is a surface acoustic wave (SAW) element. This SAW element is an element which uses a surface acoustic wave propagating along the surface of a solid body and, for example, has a structure in which plural comb electrodes making pairs called ITDs are provided on one face of a piezoelectric substrate. When an electrical signal is applied to comb electrodes making one pair, an electric field is generated around these comb electrodes, a SAW generated by excitation of these comb electrodes propagates along the surface of the piezoelectric substrate to excite comb electrodes making another pair, and the SAW is converted into an electrical signal in these comb electrodes. For example, a SAW filter, for example, as one of the SAW elements obtains a filtering function using such a conversion, and it is widely used, for example, for a portable electronic device.

The SAW element needs to secure an active region as a space for the comb electrodes to vibrate and for the SAW to propagate, and in order to prevent the comb electrodes from being corroded by moisture and damaged by impact, the active region needs to be sealed hermetically. Therefore, the SAW element is sometimes manufactured as one electronic component (SAW device) by being mounted on a printed circuit substrate and provided with a sealing member so that the active region is hermetically sealed. Various studies on materials used as the sealing member and methods for performing this sealing have been so far performed.

For example, Patent Document 1 and Patent Document 2 each disclose a SAW device in which a dam made of a photosensitive material and preventing a resin from flowing into an active region is provided on a functional face of a piezoelectric substrate of a SAW filter so as to surround comb electrodes, a paste resin is supplied so as to cover the outer periphery of the dam and the periphery of the piezoelectric substrate, then this resin is cured to become an exterior resin, and the active region is sealed by being surrounded with the exterior resin and the dam.

Patent Document 3 discloses that a first metal layer is provided on a functional face of a piezoelectric substrate of a SAW filter so as to surround input/output electrodes and comb electrodes, while an annular second metal layer is provided at a position corresponding to the first metal layer on a mounting face of a printed circuit substrate, and solder bumps on substrate electrodes on the printed circuit substrate side and a solder layer on the second metal layer on the printed circuit substrate side are formed, respectively, by printing. Cream solder is used for these solder bumps and solder layer. After the input/output electrodes are temporarily fixed onto the substrate electrodes via the solder bumps, for example, by ultrasonic thermocompression bonding, by carrying the piezoelectric substrate and the printed circuit substrate through a reflow furnace, the input/output electrodes of the SAW filter and the substrate electrodes of the printed circuit substrate are electrically connected by melting the solder bumps, and simultaneously the first metal layer and the second metal layer are bonded by melting the solder layer, thereby sealing an active region.

Patent Document 4 discloses a SAW device in which a first metal layer is provided on the entire peripheral side face of a piezoelectric substrate of a SAW filter, while a second metal layer is provided on a mounting face of a printed circuit substrate so as to surround a projection region of the piezoelectric substrate onto the mounting face, the SAW filter and the printed circuit substrate are electrically connected by bonding input/output electrodes on the piezoelectric substrate side and substrate electrodes on the printed circuit substrate side each via a solder material, and then the solder material is further supplied in a cylindrical shape so as to span the first metal layer and the second metal layer to thereby seal an active region.

Patent Document 5 discloses a SAW device in which an annular first metal layer is provided on a functional face of a piezoelectric substrate of a SAW filter so as to surround input/output electrodes and comb electrodes, while a second metal layer is provided at a position corresponding to the first metal layer on a mounting face of a printed circuit substrate, and by pressurizing the piezoelectric substrate with respect to the printed circuit substrate, the input/output electrodes of the piezoelectric substrate and substrate electrodes of the printed circuit substrate are thermocompression-bonded and electrically connected, and simultaneously the first metal layer and the second metal layer are thermocompression-bonded to thereby seal an active region.

However, in the SAW devices described in Patent Document 1 and Patent Document 2, the dam and the exterior resin sealing the active region are both composed of an organic substance. Since the organic substance generally has higher moisture permeability than inorganic substances such as metal, there is a possibility that corrosion of the comb electrode cannot be sufficiently suppressed. In these SAW devices, for example, it is thought to suppress the corrosion by forming a protective film made of SiO2 (silicon oxide) on the comb electrode or increasing the thickness of the exterior resin, but when the protective film is formed, this protective film influences the vibration of the comb electrode, which may cause a degradation in the electrical property of the SAW filter. Moreover, when the thickness of the exterior resin is increased, these SAW devices may possibly increase in size.

In the SAW device described in Patent Document 3, using the cream solder as the bumps for connecting the input/output electrodes and the solder layer for sealing, the connection between the electrodes and sealing are performed simultaneously by melting the cream solder, and therefore the older bumps wet to the respective electrodes when melted, so that the occupied area of the solder bumps becomes larger. As a result, a reduction in the size of the SAW device may possibly be hindered.

Moreover, for example, in this Patent Document 3, it is suggested that Sn (tin)—Sb (antimony)-based and Sn—Ag (silver)-based solders are used as the solder materials, but since the solidus temperatures of these solder materials are generally low, for example, from about 218° C. to about 245° C., there is a possibility that when the SAW device is mounted on another electronic device by reflowing, the solder bumps and the solder layer are melted again by heat of the reflow furnace, the electrical connection between the SAW filter and the printed circuit substrate is damaged, and that the solder layer is not uniformly fixed to respective portions when solidified after reflowing, so that the hemeticity of the active region lowers.

Further, in the SAW device described in Patent Document 4, the first metal layer is provided on the entire peripheral side face of the piezoelectric substrate of the SAW filter, but considering that the SAW filter is generally manufactured by being cut to have a predetermined size after comb electrodes are formed on the piezoelectric substrate and that the thickness of one piezoelectric substrate is, for example, from about 0.3 mm to about 0.5 mm, it is technically difficult to provide the metal layer on the entire peripheral side face of the piezoelectric substrate as described above, and even if it can be realized, it may cost a lot.

Furthermore, in the above SAW device, for sealing, the solder is supplied in a cylindrical shape so as to spread from the peripheral side face of the piezoelectric substrate of the SAW filter toward the outside on the printed circuit substrate, so that, for example, compared with when a metal layer is mounted on a functional face of a SAW filter and solder is supplied to the metal layer for sealing as in the SAW device described in Patent Document 3, the region to which the solder is supplied on the mounting substrate becomes larger. This may cause an increase in the size of the SAW device.

Moreover, in the SAW device described in Patent Document 5, the thermocompression bonding between the first metal layer and the second metal layer is performed simultaneously with the thermocompression bonding between the input/output electrodes and the substrate electrodes, but the printed circuit substrate is usually composed of ceramics or the like and therefore sometimes warps, which makes it difficult to uniformly thermocompression-bonding the electrodes and the metal layers, and raises a concern about problems such as poor connection and non-ensuring of hermeticity.

From the above circumstances, a SAW device excellent in moisture resistance and productivity capable of suppressing an influence on the electrical connection between electrodes and the hermeticity of the sealed region when it is heated for mounting on another electronic component, and further suppressing an increase in size has been demanded.

(Patent Document 1)
Japanese Patent Application Laid-open No. Hei 8-316778 (Paragraph numbers 0009, 0010 and FIG. 2)
(Patent Document 2)
Japanese Patent Application Laid-open No. 2004-64732 (Paragraph number 0024 and FIG. 1)
(Patent Document 3)
Japanese Patent Application Laid-open No. 2004-153579 (Paragraph numbers 0045 to 0047, 0061, 0062 and FIG. 2)
(Patent Document 4)
Japanese Patent Application Laid-open No. Hei 9-289429 (Paragraph number 0010 and FIG. 1)
(Patent Document 5)
Japanese Patent Application Laid-open No. 2004-214469 (Paragraph number 0040 and FIG. 1)

SUMMARY OF THE INVENTION

The present invention has been made under the above circumstances, and its object is to provide an electronic component in which a piezoelectric element is mounted on a printed circuit substrate and a vibrating part is placed in a hermetic space and which is excellent in moisture resistance and capable of ensuring the electrical connection between electrodes and the hermeticity of a sealed region and further suppressing an increase in size, and a manufacturing method thereof.

An electronic component of the present invention having a piezoelectric element provided with a vibrating part and a first electrode on one face side of a piezoelectric substrate and a printed circuit substrate, on which the piezoelectric element is mounted, provided with a second electrode electrically connected to the first electrode includes: a bump provided in advance on one of the first electrode and the second electrode and connected to the other of the first electrode and the second electrode when the piezoelectric substrate is mounted on the printed circuit substrate; an annular first metal layer provided on the one face side of the piezoelectric substrate so as to surround at least the vibrating part; and a sealing member made of a solder material with a solidus temperature lower than the bump, provided along the first metal layer, and sealing a space between the first metal layer and the printed circuit substrate to make a placement region of the vibrating part a hermetic space.

For example, the piezoelectric element is a surface acoustic wave element, and the sealing member is, for example, a solder material which has a metal selected from the group consisting of gold, silver, antimony, and copper and tin as its main components. Moreover, a second metal layer may be provided in a region touching the sealing member on the printed circuit substrate, and at least surfaces of the bump and the other of the first electrode and the second electrode connected to the bump may be made of gold.

A manufacturing method of an electronic component of the present invention includes the steps of using a piezoelectric element provided with a vibrating part and a first electrode on one face side of a piezoelectric substrate and provided with a first metal layer annularly so that at least the vibrating part is surrounded thereby, placing the one face side of the piezoelectric substrate above and facing a printed circuit substrate provided with a second electrode at a position corresponding to the first electrode; bringing a bump fixed to one of the first electrode and the second electrode into contact with the other of the first electrode and the second electrode; connecting the bump to the other of the first electrode and the second electrode at least by pressurization at a temperature lower than a solidus temperature of a solder material constituting a sealing member provided in advance on the printed circuit substrate so as to correspond to the first metal layer or provided on the first metal layer; and sealing a space between the printed circuit substrate and the first metal layer with the solder material by heating and melting the solder material at a temperature lower than a solidus temperature of the bump.

Note that "at least by pressurization" implies a case where only pressurization treatment is performed and a case both pressurization treatment and heating treatment are performed.

Another manufacturing method of an electronic component of the present invention includes the steps of: using a piezoelectric element provided with a vibrating part and a first electrode on one face side of a piezoelectric substrate and provided with a first metal layer annularly so that at least the vibrating part is surrounded thereby, placing the one face side of the piezoelectric substrate above and facing a printed circuit substrate provided with a second electrode at a position corresponding to the first electrode; bringing a bump fixed to one of the first electrode and the second electrode into contact with the other of the first electrode and the second electrode; connecting the bump to the other of the first electrode and the second electrode at least by pressurization; and sealing a space between the printed circuit substrate and the first metal layer by supplying a solder material constituting a melted sealing member onto the printed circuit substrate along the first metal layer.

In the manufacturing methods of the electronic component described above, a second metal layer may be provided in a region touching the sealing member on the printed circuit substrate, and a method of connecting the bump to the first electrode or the second electrode at least by pressurization is, for example, connection by ultrasonic vibration.

DETAILED DESCRIPTION OF THE PREFERRED EMBODIMENT

Figure 1:
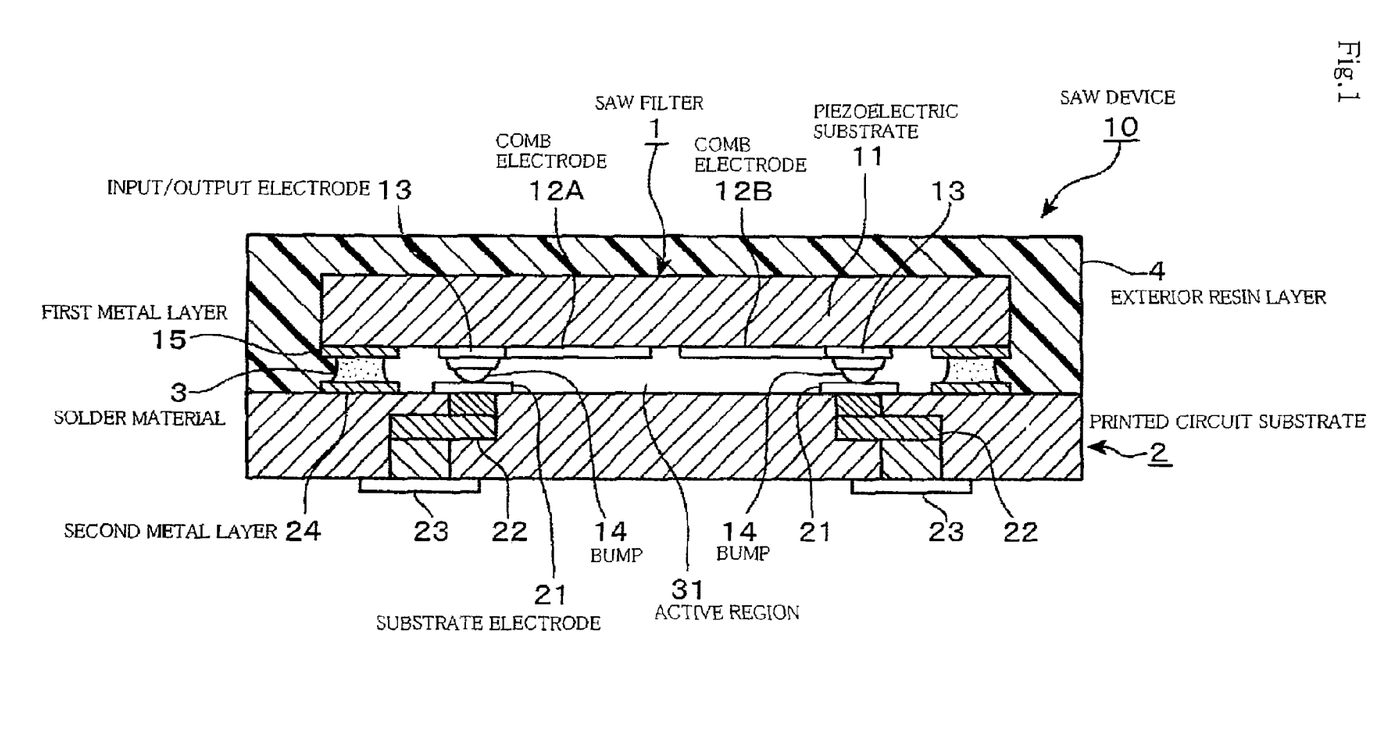
FIG. 1 is a longitudinal sectional side view showing an example of a SAW device as an electronic component according to the present invention.

An embodiment in which an electronic component according to the present invention is applied to a SAW device 10 including a SAW filter being one of SAW elements as a piezoelectric element will be described with reference to the drawings. As shown in FIG. 1, this SAW device 10 is constituted by a SAW filter 1 being the SAW element, a printed circuit substrate 2, a solder material 3 being a sealing member, and an exterior resin layer 4. Note that in this specification, an electronic component including he SAW element is called the SAW device.

Figure 2:
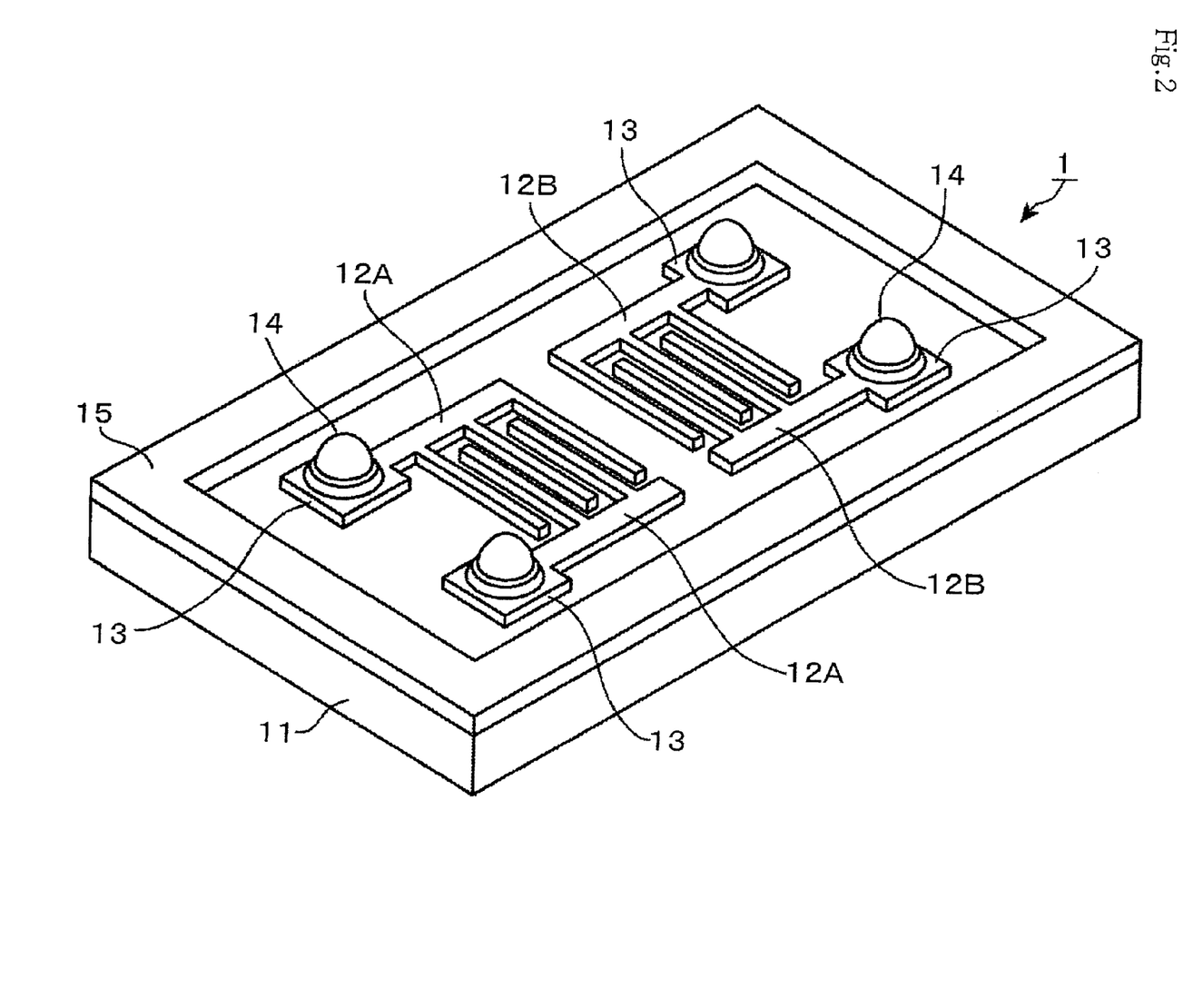
FIG. 2 is a perspective view showing an example of a SAW filter constituting the SAW device.

FIG. 2 is a perspective view of the SAW filter 1 seen from the side of a functional face (surface) side, numeral 11 denotes a piezoelectric substrate, and numerals 12A and 12B each denote a pair of comb electrodes (IDT) constituting a vibrating part. Numeral 13 denotes an input/output electrode being a first electrode, for example, made of Au (gold) and provided an end portion on the external side of each of the comb electrodes 12A and 12B. Numeral 14 denotes a bump, for example, made of Au and provided on each of the input/output electrodes 13. The comb electrode 12A (12B) and the bump 14 are electrically connected via the input/output electrode 13. On the functional face, for example, a first metal layer 15 which is annularly formed along a peripheral edge of the piezoelectric substrate 11 so as to surround the comb electrodes 12A and 12B and the input/output electrodes 13 is provided, and in this example, the surface of the first metal layer 15 is made of Au. Note that the shape and layout of the comb electrodes are not limited to this example.

Figure 3:
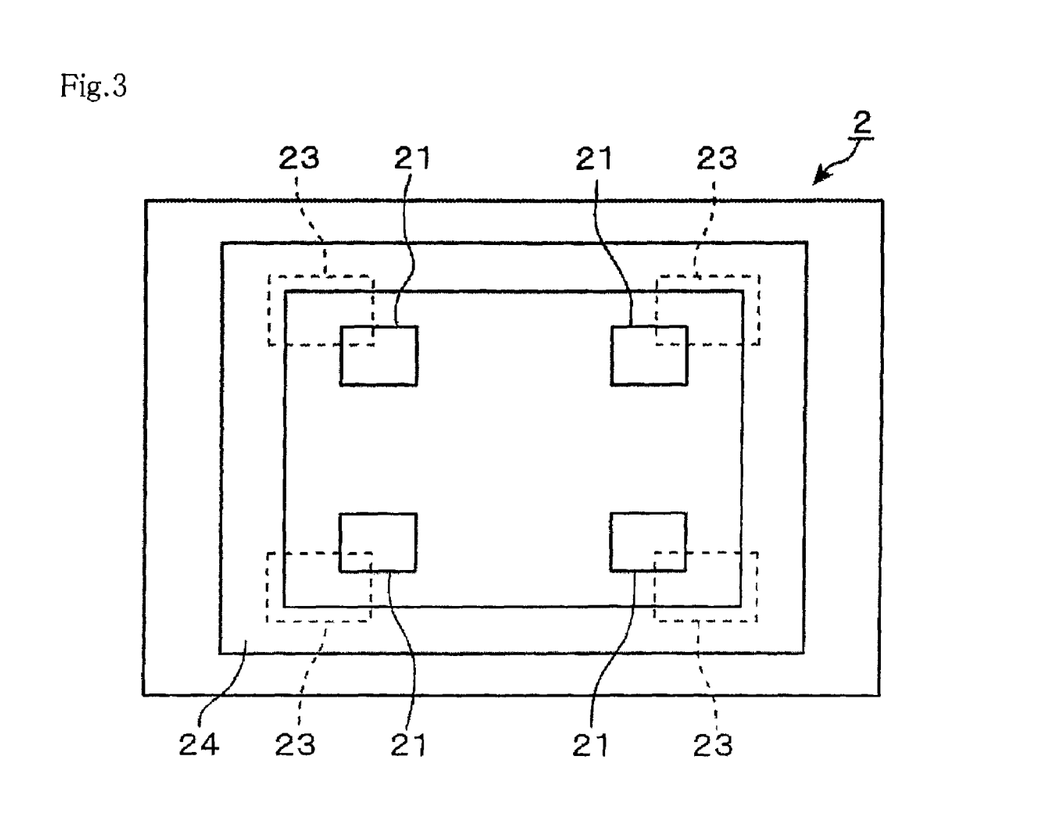
FIG. 3 is a plan view showing an example of a mounting face of a printed circuit substrate constituting the SAW device.

Next, the printed circuit substrate 2 will be described using FIG. 1 and FIG. 3. FIG. 3 shows a mounting face of the printed circuit substrate 2 on which the SAW filter 1 is mounted. The substrate used as the printed circuit substrate 2 is not particularly restricted, and for example, a printed-circuit board, a ceramic substrate, a silicon substrate, or the like may be used. Moreover, this printed circuit substrate 2 may have a flexible structure. In this example, the printed circuit substrate 2 is formed larger than the piezoelectric substrate 11, and the mounting face is provided with four substrate electrodes 21 as second electrodes, for example, whose surfaces are covered with Au at positions respectively corresponding to the input/output electrodes 13 of the piezoelectric substrate 11. Each of the substrate electrodes 21 is electrically connected to each of, for example, four rear face electrodes 23 provided on a rear face of the printed circuit substrate 2 via a wiring pattern 22 provided inside the printed circuit substrate 2, and a second metal layer 24 is provided so as to surround the four substrate electrodes 21 at a position corresponding to the first metal layer 15 on the mounting face. In this example, the second metal layer 24 has a shape overlapping the first metal layer 15, and the surface of the second metal layer 24 is made of, for example, Au. Incidentally, although in FIG. 1, the printed circuit substrate 2 and the wiring pattern 22 are schematically shown, the printed circuit substrate 2 has a two-layer structure, and in both layers, conductive paths communicating with the substrate electrode 21 and the rear face electrode 23 are formed, respectively, and these conductive paths are connected by a wiring pattern to thereby constitute the wiring pattern 22.

The solder material 3 being the sealing member is made of an alloy of Au—Sn in this example, the proportion of Au to the entire solder is, for example, 80%, and the proportion of Sn to the entire solder is, for example, 20%. Its solidus temperature is, for example, from 280° C. to 310° C. This solder material 3 is supplied annularly onto the second metal layer 24 of the printed circuit substrate 2, and fixed so as to adhere closely to the first metal layer 15 and the second metal layer 24, respectively. Incidentally, a region surrounded by the piezoelectric substrate 11, the first metal layer 15, the second metal layer 24, and the solder material 3 is an active region 31, which becomes a hermetic space by being sealed by the above respective members. As described later, in this active region 31, the comb electrodes 12A and 12B vibrate, and SAWs generated by the comb electrodes 12A and 12B propagate. In this active region 31, the bump 14 of the above SAW filter 1 is pressure-bonded onto the substrate electrode 21 in a heated state while an ultrasonic wave is applied to a bonding portion, and the rear face electrode 23 and the comb electrode 12A (12B) are electrically connected, for example, via this bump 14.

The exterior resin layer 4 is made of a thermosetting material which has, for example, an epoxy resin as its main component and provided on the printed circuit substrate 2 so as to cover the solder material 3, the piezoelectric substrate 11, the first metal layer 15, and the second metal layer 24. Incidentally, the height of the entire SAW device 10 is, for example, 1 mm, and the height of the active region 31 (length between the piezoelectric substrate 11 and the printed circuit substrate 2) is, for example, 20 μm.

Meanwhile, in this SAW device 10, in place of the above solder material 3, a solder member made of another metal may be used as the sealing member. Moreover, the bump 14 is not necessarily composed of Au, and, for example, it is suitable that only the surface of the bump 14 be composed of Au and portions other than the surface be composed of metal other than Au, but, for example, in order to prevent the bump 14 from being melted when the solder material 3 is melted to seal the active region 31 in a manufacturing process of the SAW device 10 as described later, the solder material 3 needs to have a solidus temperature lower than a solidus temperature of a material composing the bump 14.

Further, the surface of the first metal layer 15 is not necessarily composed of Au, but as a material composing the surface of the first metal layer 15, a material having a high affinity for a material composing the solder material 3 is used in order that the active region 31 is hermetically sealed. The expression "high affinity" here means that when melted by heating, the solder material 3 wets to the first metal layer 15 and adheres closely to the first metal layer 15.

Incidentally, in the SAW device 10, the active region 31 is only required to be hermetically sealed, so that the surface of the second metal layer 24 is only required to be composed of a material which the solder material 3 fits in well with, and is not necessarily composed of Au. When the solder material 3 fits in well with the printed circuit substrate 2, the second metal layer 24 may not be provided. The expression "the solder material fits in well with" here means that the melted solder material wets and this melted solder material is fixed when cooled and solidified.

Figure 4:
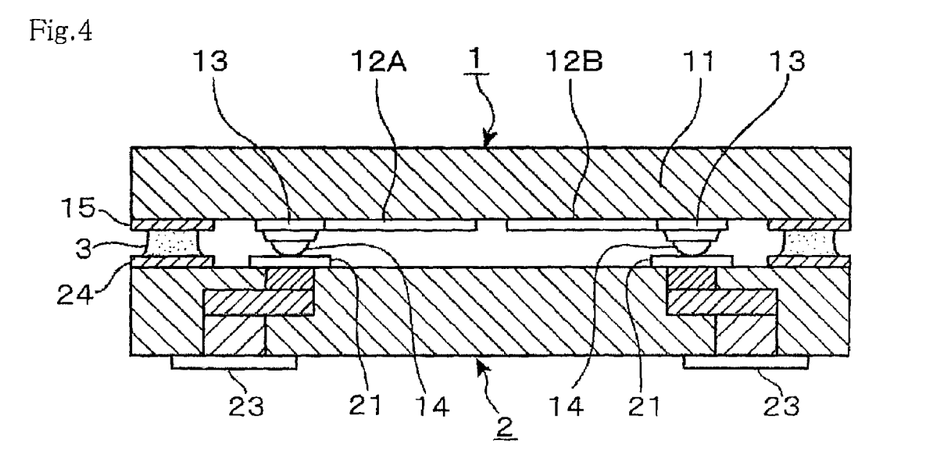
FIG. 4 is a longitudinal sectional side view showing another example of the SAW device as the electronic component according to the present invention.

Meanwhile, in the above embodiment, the exterior resin layer 4 is provided in order to not only increase the impact resistance of the SAW device 10 but also increase the hermeticity of the active region 31, but as shown in FIG. 4, a device constitution in which the exterior resin layer 4 is not provided is also possible. A SAW device shown in FIG. 4 is constituted in the same manner as the SAW device 10 shown in FIG. 1 except that the exterior resin layer 4 is not provided and that the printed circuit substrate 2 is formed with the same size as the piezoelectric substrate 11.

Instead of providing the exterior resin layer 4, a layer made of an inorganic material such as metal, glass, or ceramics may be provided so as to cover the solder material 3, the piezoelectric substrate 11, the first metal layer 15, and the second metal layer 24, and if the layer made of metal is provided, for example, the solder material 3, the piezoelectric substrate 11, the first metal layer 15, and the second metal layer 24 may be plated, for example, with nickel so as to be covered therewith.

In the SAW device 10 thus constituted, if an electrical signal is applied to the comb electrodes 12A, for example, via the rear face electrodes 23, the comb electrodes 12A are excited to generate a SAW, and the SAW propagates in the active region 31. When the comb electrodes 12B are excited by this SAW, an electrical signal with a predetermined frequency band is generated in these comb electrodes 12B, and this electrical signal is outputted to the rear face electrodes 23 which are electrically connected to the comb electrodes 12B.

According to the SAW device 10 of this embodiment, the active region 31 being the hermetic space is formed by surrounding the comb electrodes 12A and 12B on the SAW filter 1 side by the solder material 3, and the solder material 3 is excellent in hermeticity with almost no moisture permeation and moisture absorption, so that moisture permeation into the active region 31 is suppressed, and corrosion of the comb electrodes 12A and 12B in the active region 31 is suppressed. As a result, high weather resistance of the SAW device 10 can be obtained. Moreover, the outward spread of the solder material 3 can be suppressed, compared with when the solder material 3 is provided so as to surround a peripheral side face of the piezoelectric substrate 11 of the SAW filter 1, so that an increase in the size of the SAW device 10 can be suppressed.

Further, in this example, Au—Au thermocompression bonding is achieved by heating the bumps 14 fixed to the input/output electrodes 13 of the SAW filter 1 and the substrate electrodes 21 on the printed circuit substrate side by ultrasonic energy, and hence certain bonding between them is mechanically and electrically realized. The solder material 3 with a solidus temperature lower than the bumps 14 is used as a solder material (sealing member) for sealing, the bumps 14 and the substrate electrodes 21 are electrically connected by thermocompression bonding, and the active region 31 which surrounds the comb electrodes 12A and 12B of the SAW filter 1 is hermetically sealed by melting the solder material 3. Therefore, compared with when solder is used as the bump 14 and electrodes are electrically connected by melting the solder as is conventionally done, a space for the solder to spread can be omitted, and consequently, the size of the SAW filter 1 can be reduced. Even when there is a warp in the printed circuit substrate 2 or the piezoelectric substrate 11, the process of electrically connecting the bumps 14 and the substrate electrodes 21 and the process of sealing the active region 31 can be performed separately, so that the bumps 14 and the substrate electrodes 21 can be certainly electrically connected, and since a peripheral edge portion of the piezoelectric substrate 11 is also sealed by melting the solder material 3, the solder material 3 is uniformly fixed to respective portions, so that certain hermeticity of the active region 31 can be obtained, and consequently the highly reliable SAW device 10 can be obtained.

Incidentally, in the above SAW device 10, for example, it is possible to provide the bump 14 on the substrate electrode 21 instead of providing the bump 14 on the input/output electrode 13, and pressure-bond the bump 14 and the input/output electrode 13 by heating. Moreover, it is also possible to provide the input/output electrode 13 and the bump 14 respectively outside the first metal layer 15, provide the substrate electrode 21 outside the second metal layer 24, and perform pressure bonding while the bump 14 and the input/output electrode 13 are heated in the same manner as the above SAW device 10. Namely, a connecting portion between the input/output electrode 13 and the substrate electrode 21 by the bump 14 may be located outside the hermetic space surrounded by the solder material 3. Furthermore, the input/output electrode 13 may be composed of Al (aluminum) without being limited to Au, and the bump 14 and the substrate electrode 21 are not limited to the above material as long as they can be thermocompression-bonded.

Next, an example of a manufacturing process of the SAW device shown in FIG. 1 will be described using FIG. 5A to FIG. 7C, and first, a large-sized printed circuit substrate 20 used in this manufacturing process will be described in advance. In this large-sized substrate 20, in each mounting region on which the SAW filter 1 is mounted, the substrate electrodes 21 and the second metal layer 24 are provided in the same layout as that of the above printed circuit substrate 2, on a rear face of the large-sized substrate 20, the rear face electrodes 23 electrically connected to the respective substrate electrodes 21 are provided, and, so to speak, the large-sized printed circuit substrate 20 has a structure in which many printed circuit substrates 2 described above lie in a horizontal direction. In this example, to shorten the time required for the respective process steps, many SAW filters 1 are mounted on respective mounting regions of this large-sized printed circuit substrate 20 and collectively subjected to treatments in respective process steps described later.

Figure 5A:
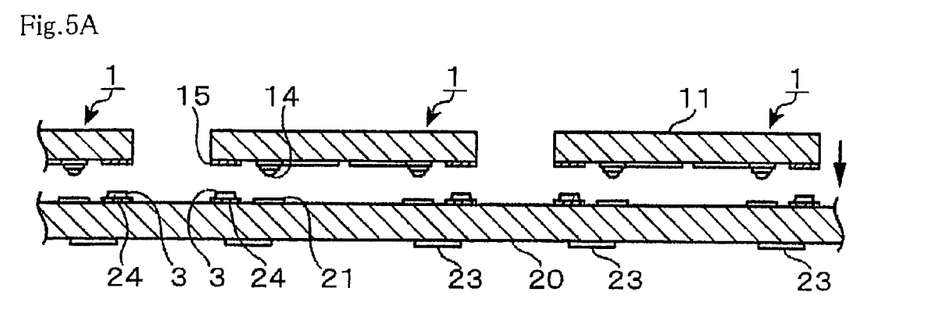
FIG. 5A to FIG. 5C are process views showing an example of a manufacturing method of the SAW device described above.

First, the paste solder material 3 is annularly deposited to have an almost uniform height on each of the second metal layers 24 of the large-sized printed circuit substrate 20, for example, by a printing method, and this large-sized printed circuit substrate 20 is placed, for example, on a heater block. Subsequently, positioning of the SAW filters 1 is performed so that the bumps 14 of the SAW filter 1 is situated above the substrate electrodes 21 and the first metal layer 15 and the second metal layer 24 face each other in each of the mounting regions of the large-sized printed circuit substrate 20 (FIG. 5A). Incidentally, the method for depositing the solder material 3 is not limited to this printing method, and, for example, may be performed by a plating method or by dispensing the paste solder.

Figure 5B:
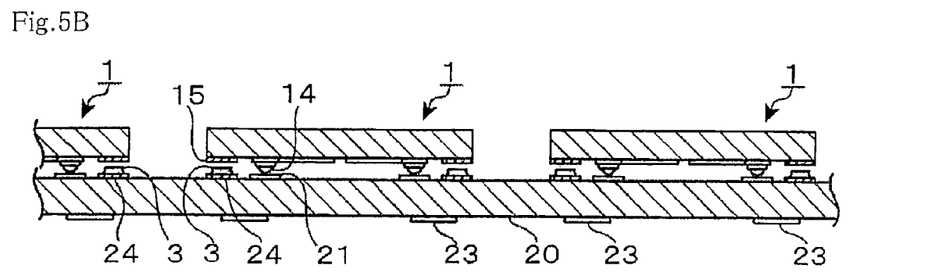

After the above positioning, by bringing the bumps 14 into contact with the substrate electrodes 21, heating the large-sized printed circuit substrate 20 and the SAW filters 1 via the heater block, and giving ultrasonic vibration having a preset frequency to the bumps 14 while pressurizing the piezoelectric substrates 11 to the large-sized printed circuit substrate 20 at a preset pressure, for example, by an ultrasonic flip chip bonder or the like to vibrate the bumps 14, the bumps 14 and the substrate electrodes 21 are ultrasonically thermocompression-bonded (FIG. 5B). If the bumps 14 and the substrate electrodes 21 are ultrasonically thermocompression-bonded as just described, the time required to connect the bumps 14 and the substrate electrodes 21 can be kept, for example, at one second or less, so that the manufacturing time of the SAW device 10 can be shortened, for example, compared with when the bumps 14 and the substrate electrodes 21 are pressure-bonded while being heated without the bumps 14 being ultrasonically vibrated, and consequently the productivity of the SAW device 10 can be increased. Incidentally, heating in this ultrasonic thermocompression bonding step is performed at a temperature lower than the solidus temperature of the solder material 3 in order to prevent only part of the melted solder material 3 from adhering to the first metal layer 15 due to a warp in the piezoelectric substrate 11 or the printed circuit substrate 2 and sufficient hermeticity of the active region 31 from not being obtained.

Figure 5C:
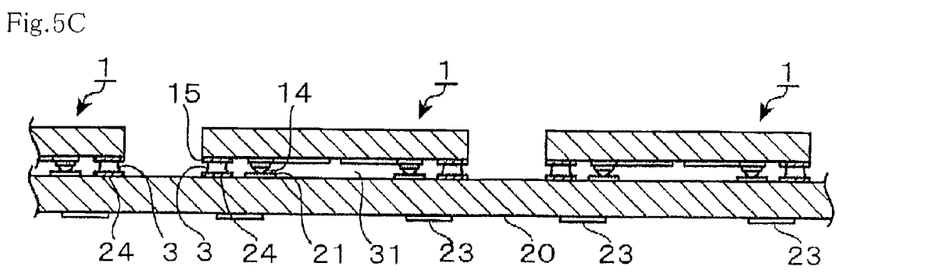

Then, the solder material 3 is melted by carrying the above ultrasonically thermocompression-bonded large-sized printed circuit substrate 20 and SAW filters 1, for example, into a reflow furnace and heating them in a nitrogen atmosphere at a preset temperature. The melted solder material 3 is expanded by heat, wets and adheres to the first metal layer 15 of the piezoelectric substrate 11, so that the active region 31 is hermetically sealed (FIG. 5C). Note that in order to prevent the bumps 14 from being melted, the above heating in the reflow furnace is performed at a temperature lower than the solidus temperature of the bumps 14.

Figure 7A:
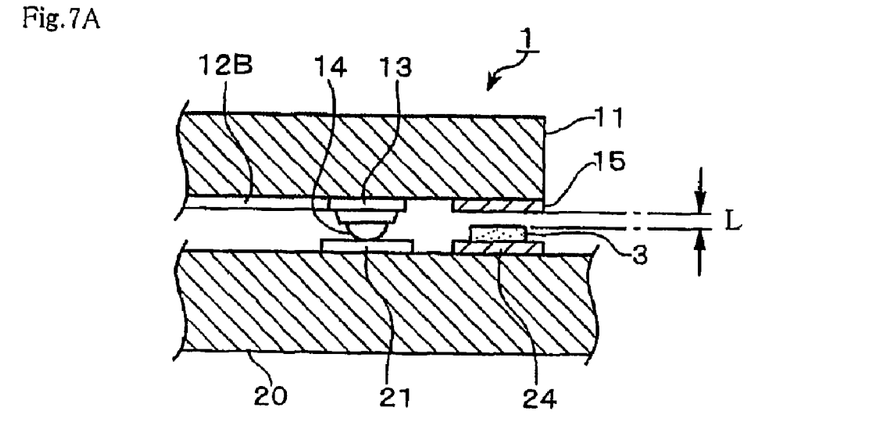
FIG. 7A to FIG. 7C are explanatory views showing changes in solder constituting the SAW device in a manufacturing process of the SAW device.
Figure 7B:
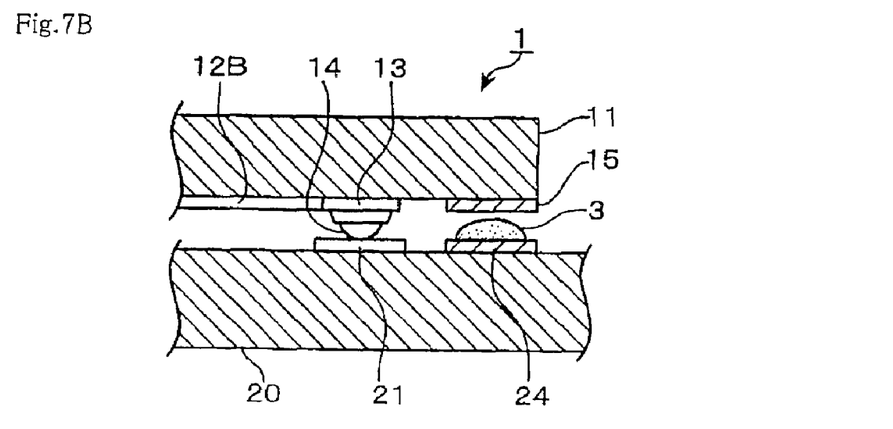
Figure 7C:
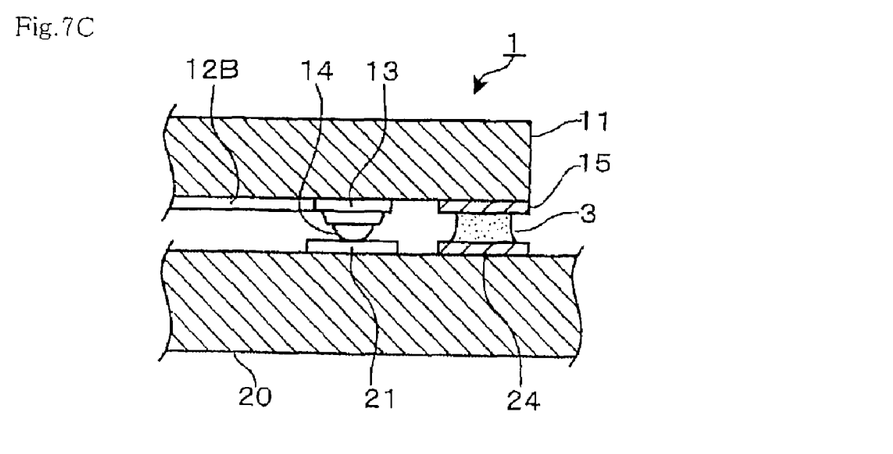

FIG. 7A to FIG. 7C show states in which when the above heating is performed in the reflow furnace, the shape of the solder material 3 changes and the above sealing is performed. FIG. 7A shows the solder material 3 before the heating in the reflow furnace, and in this example, a gap L, for example, from about 5 μm to about 15 μm is provided between the first metal layer 15 and the solder material 3. When the solder material 3 is heated by the reflow furnace, the volume of the solder material 3 expands and further when the solder material 3 is melted, the solder material 3 wets to the second metal layer 24, and as shown in FIG. 7B, a portion between the outer peripheral side and the inner peripheral side rises by surface tension over the entire periphery of the annularly supplied solder material 3. When the solder material 3 expands by further heating and touches the first metal layer 15, as shown in FIG. 7C, the solder material 3 wets and adheres to the first metal layer 15, so that the active region 31 is sealed.

Meanwhile, the above gap may be 5 μm or less, and if the solder material 3 adheres to the first metal layer 15 to seal the active region 31 and the function of the manufactured SAW device 10 is not damaged when the solder material 3 is melted, the solder material 3 may be brought into contact with the first metal layer 15 without this gap L being provided. Incidentally, in order that the gap L has a desired size, for example, the first metal layer 15 and the second metal layer 24 are previously formed so as to have thicknesses corresponding to the size of the gap L.

Figure 6A:
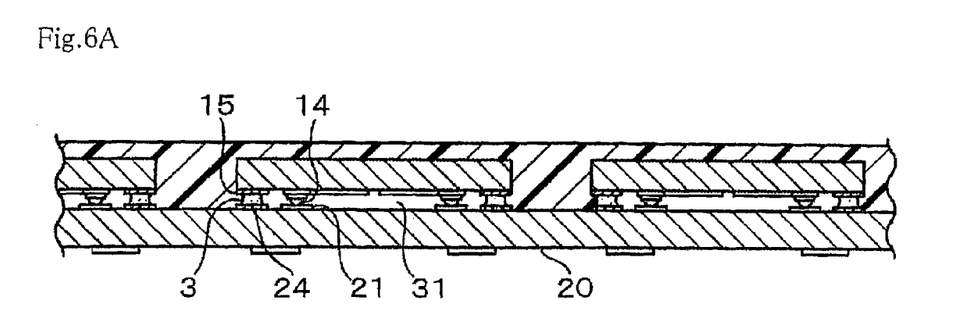
FIG. 6A and FIG. 6B are process views showing the example of the manufacturing method of the SAW device described above.
Figure 6B:
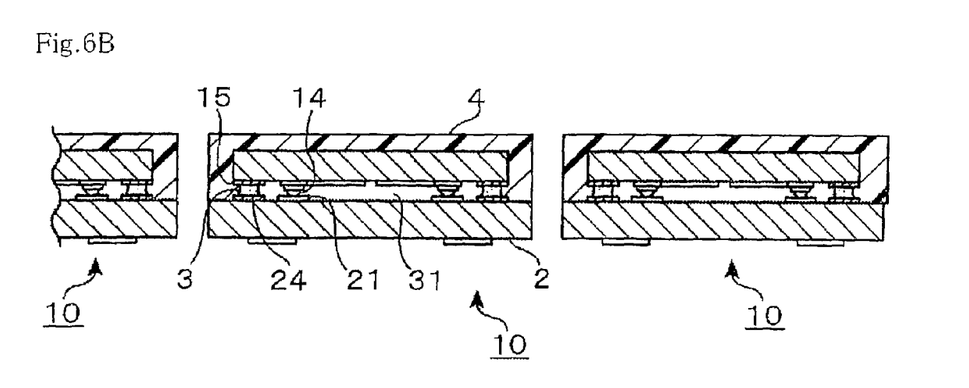

After sealing is performed as just described, the SAW filters 1 and the large-sized printed circuit substrate 20 are carried out of the reflow furnace, and after the solder material 3 is cooled and solidified, as shown in FIG. 6A, a paste thermosetting resin which has, for example, an epoxy resin as its main component is supplied onto the large-sized printed circuit substrate 20 so as to cover the surfaces of the piezoelectric substrates 11 and the solder material 3. Thereafter, by curing this resin by heating, the external resin layer 4 is formed, and by cutting the large-sized printed circuit substrate 20 and the exterior resin layer 4 together into units each including the necessary SAW device 10 along a vertical axis, the SAW devices 10 are manufactured (FIG. 6B).

Figure 8A:
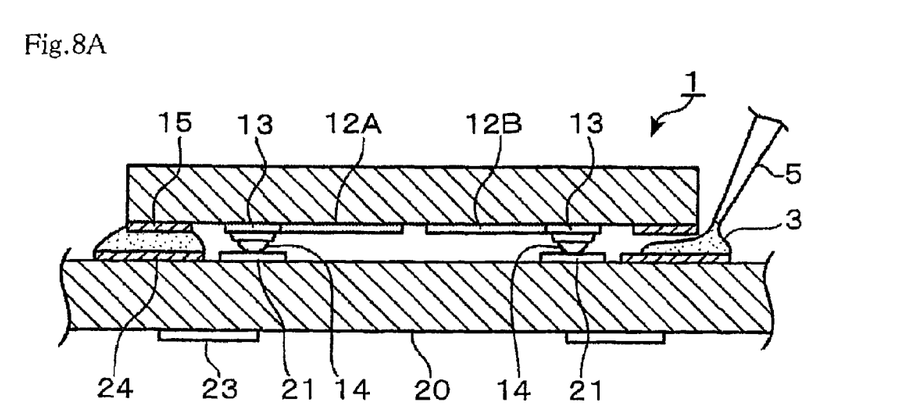
FIG. 8A and FIG. 8B are explanatory views showing another example of the manufacturing method of the SAW device as the electronic component according to the present invention.
Figure 8B:
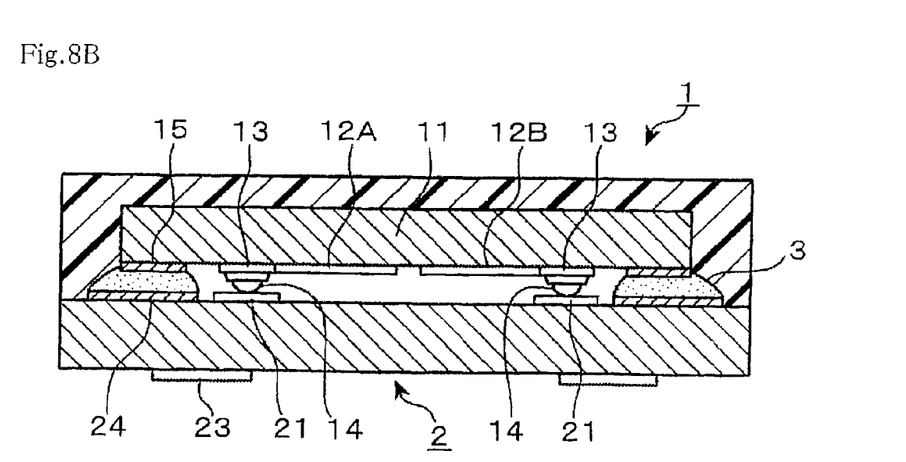

Meanwhile, in the above manufacturing method of the SAW device 10, it is also possible that by supplying the melted solder material 3 onto the second metal layer 24 via a dispenser 5 so as to fill the gap provided between the second metal layer 24 and the first metal layer 15, for example, using a jet-type solder bath or a melting-type solder feeder as shown in FIG. 8A after ultrasonically thermocompression-bonding the bumps 14 and the substrate electrodes 21 as described above instead of depositing the solder material 3 on the second metal layer 24 and melting the solder material 3 by heating before the above ultrasonic thermocompression bonding, the active region 31 is sealed, then the exterior resin layer 4 is formed in the same manner as in the above manufacturing method, and the exterior resin layer 4 and the large-sized printed circuit substrate 20 are cut into units each including the SAW device, thereby manufacturing the SAW device 10 (FIG. 8B). Note that when the SAW device 10 is manufactured by such a manufacturing method, to prevent the solder material 3 supplied onto the second metal layer 24 from running down onto the large-sized printed circuit substrate 20, the peripheral edge portion of the second metal layer 24 may be provided to extend farther outward than the side peripheral face of the piezoelectric substrate 11 as shown in FIG. 8A and FIG. 8B.

Incidentally, in the above manufacturing method of the SAW device 10, the bump 14 and the substrate electrode 21 are connected by ultrasonic thermocompression bonding, but in place of this ultrasonic thermocompression bonding, they may be connected by pressure bonding, for example, by applying heat lower than the solidus temperature of the solder material 3 to the bump 14 and the substrate electrode 21 while pressurizing these bump 14 and substrate electrode 21 to cause solid phase diffusion.

Moreover, when the surfaces of the bump 14 and the substrate electrode 21 are respectively composed of, for example, gold or copper, the bump 14 and the substrate electrode 21 may be connected by pressure bonding by planarizing a contact face of the bump 14 with the substrate electrode 21 and a contact face of the substrate electrode 21 with the bump 14 respectively, cleaning the bump 14 and the substrate 21 by removing particles on these contact faces, and thereafter, for example, pressurizing them without applying heat.

The SAW device including the SAW filter 1 as the SAW element has been described in the above embodiment, but a SAW device including, for example, a SAW resonator which is a SAW element provided with comb electrodes and reflectors as the vibrating part on the piezoelectric substrate 11 in place of the SAW filter 1 may be used, and an element other than the SAW element may be used as the piezoelectric element.

According to the present invention, the hermetic space is formed by surrounding the vibrating part on the piezoelectric element side by the solder material, and the solder material is a material excellent in hermeticity with almost no moisture permeation and moisture absorption, so that moisture permeation into the hermetic space is suppressed, and corrosion of the vibrating part in the space is suppressed. As a result, high weather resistance of the electronic component can be obtained. Moreover, the outward spread of the solder material can be suppressed, compared with when the solder material is provided so as to surround the peripheral side face of the substrate on the piezoelectric element, so that an increase in the size of the electronic component can be suppressed.

Further, the solder material with a solidus temperature lower than the bump to connect the electrode on the piezoelectric element side and the electrode on the printed circuit substrate side is used as a solder material (sealing member) for sealing, the bump and the substrate electrode are electrically connected at least by pressurization such as thermocompression bonding (a process of performing pressure boding in a heated state), and the placement region of the vibrating part of the piezoelectric element is hermetically sealed by melting the solder material. Therefore, compared with when the solder is used as the bump and the electrodes are electrically connected by melting the solder as is conventionally done, a space for the solder to spread can be omitted, so that the size of the electronic component can be reduced, and even when there is a warp in the printed circuit substrate or the piezoelectric substrate, the process of electrically connecting the bump and the electrode and the process of sealing the placement region of the vibrating part (active region) can be performed separately, so that the bump and the substrate electrode can be certainly electrically connected, and the solder material can be fixed to respective portions with high uniformity, which makes it possible to ensure the sufficient hermeticity of the above space.

What is claimed is:

1. A method for manufacturing an electronic component, comprising:
   forming a piezoelectric device on a surface of a substrate, said piezoelectric device including a vibration unit, a first electrode electrically connected to said vibration unit, and a first metal layer provided on said surface so as to annularly surround at least said vibration unit;
   forming a printed circuit substrate provided with a second electrode;
   fixing a conductive bump to one of said first electrode and said second electrode;
   providing solder material, with a solidus temperature lower than a solidus temperature of said bump, as an annular layer on one of:
      said printed circuit substrate wherein said annular layer is configured to correspond to and be contacted with said first metal layer completely around an annulus of said first metal layer; and
      said first metal layer;
   aligning said piezoelectric device and said printed circuit substrate in an aligned state such that:
      said bump is aligned to face and contact another one of said first electrode and said second electrode; and
      an annular gap is formed between said annular layer of said solder material and another one of said printed circuit substrate and said first metal layer;
   heating said bump to a temperature lower than the solidus temperature of said solder material so as not to melt said solder material, and press-bonding said bump to said another one of said first electrode and said second electrode; and
   heating, melting and expanding said solder material at a temperature lower than the solidus temperature of the bump, after said heating and said press-bonding is completed and with said piezoelectric device and said printed circuit board in said aligned state and stationary relative one another, so as to fill said annular gap with said solder material thereby forming a sealing member connecting said first metal layer with said printed circuit substrate via the solder material, and sealing a space between said printed circuit substrate and first metal layer.

2. The method for manufacturing an electronic component according to claim 1, wherein said printed circuit board is provided with a second metal layer fixed on said printed circuit board and in contact with said solder material.

3. The method for manufacturing an electronic component according to either one of claims 1 or 2, wherein the step for press-bonding said bump to said another one of said first electrode and said second electrode is carried out by application of ultrasonic waves to said bump.

4. The method for manufacturing an electronic component according to claim 3 wherein at least a surface of said bump is made of gold.

5. The method for manufacturing an electronic component according to claim 4 wherein said annular gap is not greater 15 micrometers.

6. The method for manufacturing an electronic component according to claim 2 wherein at least a surface of said bump is made of gold.

7. The method for manufacturing an electronic component according to claim 6 wherein said annular gap is not greater than 15 micrometers.

8. The method for manufacturing an electronic component according to claim 1 wherein at least a surface of said bump is made of gold.

9. The method for manufacturing an electronic component according to claim 8 wherein said annular gap is not greater than 15 micrometers.

10. The method for manufacturing an electronic component according to claim 2 wherein said annular gap is not greater than 15 micrometers.

11. The method for manufacturing an electronic component according to claim 2 wherein said annular gap is not greater than 15 micrometers.

* * * * *